(12) United States Patent
Ren et al.

(10) Patent No.: US 7,544,558 B2
(45) Date of Patent: Jun. 9, 2009

(54) METHOD FOR INTEGRATING DMOS INTO SUB-MICRON CMOS PROCESS

(75) Inventors: Chong Ren, Shanghai (CN); Xian-Feng Liu, Shanghai (CN); Huang Hai Tao, Shanghai (CN)

(73) Assignee: BCD Semiconductor Manufacturing Limited, Grand Cayman (KY)

( * ) Notice: Subject to any disclaimer, the term of this patent is extended or adjusted under 35 U.S.C. 154(b) by 423 days.

(21) Appl. No.: 11/373,278

(22) Filed: Mar. 13, 2006

(65) Prior Publication Data

US 2007/0212823 A1    Sep. 13, 2007

(51) Int. Cl.
*H01L 21/20* (2006.01)

(52) U.S. Cl. .................. 438/201; 438/262; 438/268; 257/E21.418; 257/E21.632; 257/E21.645; 257/E27.067; 257/E27.081; 257/E29.04; 257/E29.258

(58) Field of Classification Search .......... 438/142, 438/201, 262, 268; 257/E21.696, E29.256, 257/E27.064, E29.258, E21.417, E21.418, 257/632, 645, E27.067, 81, E29.04, 258
See application file for complete search history.

(56) References Cited

U.S. PATENT DOCUMENTS

| 4,417,385 | A | * | 11/1983 | Temple ........................ 438/138 |
| 4,571,606 | A | * | 2/1986 | Benjamin et al. ............ 257/339 |
| 4,622,568 | A | * | 11/1986 | Schutten et al. ............. 257/122 |
| 4,742,380 | A | * | 5/1988 | Chang et al. ................. 257/125 |
| 4,878,096 | A | * | 10/1989 | Shirai et al. ................. 257/338 |
| 4,887,142 | A | * | 12/1989 | Bertotti et al. .............. 257/338 |
| 5,156,989 | A | * | 10/1992 | Williams et al. ............ 438/206 |
| 5,321,293 | A | * | 6/1994 | Mojaradi et al. ............ 257/369 |
| 5,491,105 | A | | 2/1996 | Smayling et al. |
| 5,515,319 | A | * | 5/1996 | Smayling et al. ........ 365/185.27 |
| 5,550,072 | A | * | 8/1996 | Cacharelis et al. .......... 438/201 |
| 5,854,099 | A | * | 12/1998 | Farrenkopf .................. 438/201 |
| 5,899,714 | A | * | 5/1999 | Farrenkopf et al. ......... 438/202 |
| 6,022,778 | A | | 2/2000 | Contiero et al. |
| 6,069,034 | A | * | 5/2000 | Gregory ...................... 438/201 |
| 2003/0025144 | A1 | * | 2/2003 | Liou .......................... 257/306 |

* cited by examiner

*Primary Examiner*—Michael S Lebentritt
(74) *Attorney, Agent, or Firm*—Muncy, Geissler, Olds & Lowe, PLLC

(57) ABSTRACT

This invention is forming the DMOS channel after CMOS active layer before gate poly layer to make the modular DMOS process step easily adding into the sub-micron CMOS or BiCMOS process. And DMOS source is formed by implant which is separated by a spacer self-aligned to the window for DMOS body. By this method, the performance of CMOS and bipolar devices formed original CMOS or BiCMOS process keeps no change. The product design kit, such as standard cell library of CMOS and BiCMOS, can be used continuously with no change.

7 Claims, 12 Drawing Sheets

METHOD FOR INTEGRATING DMOS INTO SUB-MICRON CMOS PROCESS

FIELD OF THE INVENTION

The present invention relates to a fabrication method for semiconductor, particularly to a method for integrating DMOS into a sub-micron CMOS process or a sub-micron BiCOMS process.

BACKGROUND OF THE INVENTION

DMOS is the abbreviation of "Double Diffused Metal Oxide Semiconductor", which can achieve a very high working frequency and a very high operational speed, wherein two dopants of opposite conductivity types are diffused through an identical window to form self-aligned sub-micron channels.

According to DMOS structures, DMOS can be classified into LDMOS (lateral DMOS) and VMOS (vertical DMOS). LDMOS has three electrodes all extending from the upper surface thereof and is suitable to integrate with other elements. In a LDMOS, the source and the body are formed via a self-aligned diffusion; however, the gate layer and the drain are respectively formed via separated diffusion processes so that the input capacitor and the feedback capacitor can be reduced, and the short-channel effect can also be relieved. In a VDMOS, an N⁻ epitaxial layer is grown from an N⁺ silicon substrate; after flowing through the channels, electrons flow vertically to exit from the substrate; therefore, the drain electrode extends from the bottom of the chip, and there are only the source electrode and the gate electrode on the top surface of the chip; such a structure can promote the integration level but will limit the usage. In comparison with common MOS transistors, the structure of LDMOS has two features: firstly, P-type and N-type dopants are sequentially diffused through an identical window of an oxide layer to form a very short channel; and secondly, a lightly doped N⁻ drift zone is formed between the channel zone and the drain zone with the doping concentration of the N⁻ drift zone less than that of the channel zone. The N⁻ drift zone sustains most of the applied leakage voltage and increases the punchthrough voltage; therefore, LDMOS can combine the advantages of a high punchthrough voltage and a short channel.

DMOS is a double diffused MOS and its channel length is defined by the two dopants of opposite conductivity types diffused from same window which is formed by single mask to get the channel length very well controlled. In general, the gate poly is used as the window. Since the dopant diffusion needs high temperature drive while sub-micron CMOS (Complementary Metal Oxide Semiconductor) can not afford this thermal cycle, it is difficulty to integrated DMOS in sub-micron CMOS process forming a CDMOS process or sub-micron BiCMOS process forming a Bi-CDMOS process.

U.S. Pat. Nos. 5,491,105 and 6,022,778 have patented their method to solve above problem. U.S. Pat. No. 5,491,105 forms the DMOS body and source by implant two dopants with different diffusion rate through same mask window and then high temperature drive them to define the DMOS channel length before the CMOS active layer. U.S. Pat. No. 6,022,778 forms the DMOS body after gate poly layer by large angle implant and low temperature anneal. To mask the high energy large angle implant the polyside gate material must be used.

U.S. Pat. No. 5,491,105 is really a simple and cost effective method, but it is hard to form PDMOS due to diffusion rates of boron and arsenic are difference while phosphorous and boron are almost same. U.S. Pat. No. 6,022,778 is also a very good method, but its cost is relatively high due to the polyside gate and large angle implant equipment.

SUMMARY OF THE INVENTION

Consequently, for solving the abovementioned problems, the present invention proposes a modular method to integrate DMOS (LDMOS and VDMOS) into sub-micron CMOS or BiCMOS process. By this method, the performance of CMOS and bipolar devices formed original CMOS or BiCMOS process keeps no change. So, the product design kit, such as standard cell library of CMOS and BiCMOS, can be used continuously.

The fabrication method of the present invention essentially comprises the following steps: burying buried layers needed by DMOS into a semiconductor substrate; forming a TUB structure needed by HV DMOS in the succeeding process, and forming a well structure needed by LV DMOS and CMOS in the succeeding process; utilizing a silicon nitride layer and a field oxidation to define required active regions, and utilizing a thermal oxidation process to form a required field oxide layer, wherein the process from forming the well structure to forming the field oxide layer may adopt the process originally used by CMOS; sequentially forming a first polysilicon layer and a silicon nitride layer; utilizing a lithographic process to form a pattern required by DMOS bodies; performing a body ion implant process and a drive-in process to form the required DMOS bodies; utilizing PECVD to form a $SiO_2$ film; utilizing a dry-etching process to selectively remove the $SiO_2$ film on the silicon nitride layer and to cut given-size openings at the central regions of the $SiO_2$ films above the DMOS bodies; utilizing those openings to perform a DMOS source implant process to form required DMOS sources; and utilizing a capacitor mask and a lithographic process to selectively etch the silicon nitride layer and the first polysilicon layer so that the silicon nitride layers will be the dielectric layers of capacitors and the first polysilicon layers will be the lower electrodes of the capacitors.

Succeeding to the abovementioned process, the standard CMOS process follows. The following processes are sequentially performed, including: forming a gate dielectric layer, modulating CMOS Vt, forming gate electrodes on of a second polysilicon layer, forming electrode structures of capacitors, and forming CMOS drain electrodes and source electrodes via an LDD (Lightly Doped Drain) process and the related structure. Then, a multilayer-wiring process is performed, and next, a protective layer is formed on the chip, and next, the pattern of contact windows are defined on the protective layer, and the protective layer is selectively etched to form the contact window, and lastly, a metallic layer is deposited and patterned on the protective layer. Thus, a CDMOS structure, which integrates DMOS into a sub-micron CMOS process, is completed.

In the present invention, the TUB structure and the well structure are simultaneously either N-type or P-type, and the DMOS body is also either N-type or P-type, but the conductivity type of the DMOS body is different from that of the TUB and well structures. The dose of the body ion implant depends on the punchthrough voltage and the threshold voltage required by DMOS.

This invention provides a solution by forming the DMOS channel after CMOS active layer while before gate poly layer to make the modular DMOS process step easily adding into the sub-micron CMOS or BiCMOS process. The advantages of this method are:

1. DMOS body is formed by high energy implant only for low-voltage DMOS and high energy/low energy implant for high voltage DMOS to control the punchthrough voltage and threshold voltage separately.

2. DMOS source is formed by implant which is separated by a spacer self-aligned to the window for DMOS body.

3. A low temperature anneal is used to active the body implant and source implant. So, the DMOS channel is defined by the spacer width and following temperature cycle.

4. Since the DMOS body and source is formed before gate oxidation and CMOS Vt implant and gate poly, there is no influence to the sub-micron CMOS device performance. So, the DMOS and CMOS devices can be optimized separately.

DETAILED DESCRIPTION OF THE PREFERRED EMBODIMENTS

The technical contents of the present invention will be described below in detail via the exemplification of a NDMOS process and the attached drawings.

Figure 1:
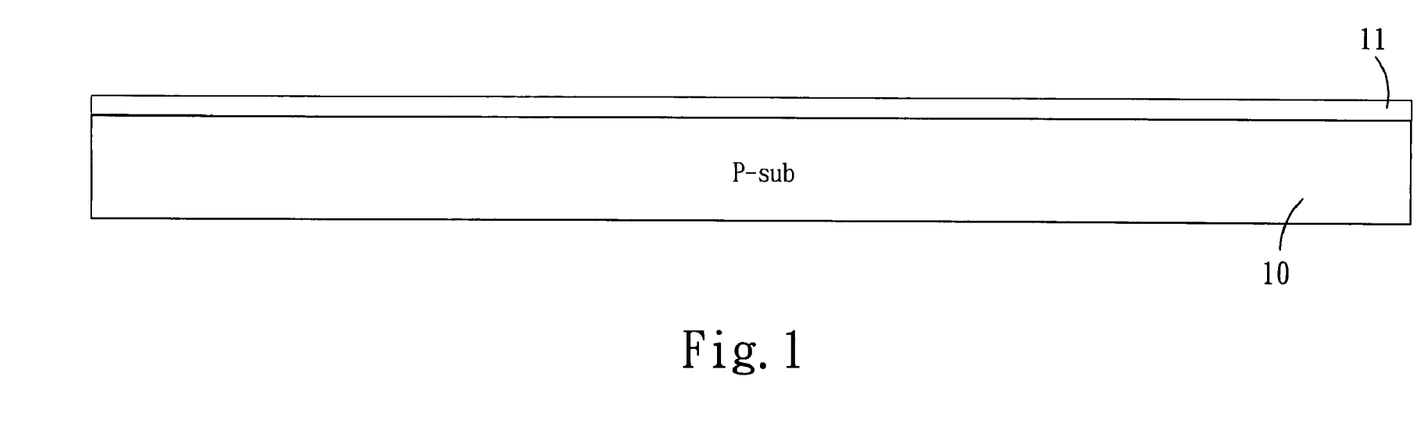
FIG. 1 to FIG. 20 are sectional views schematically showing the fabrication process of NDMOS.
Figure 2:
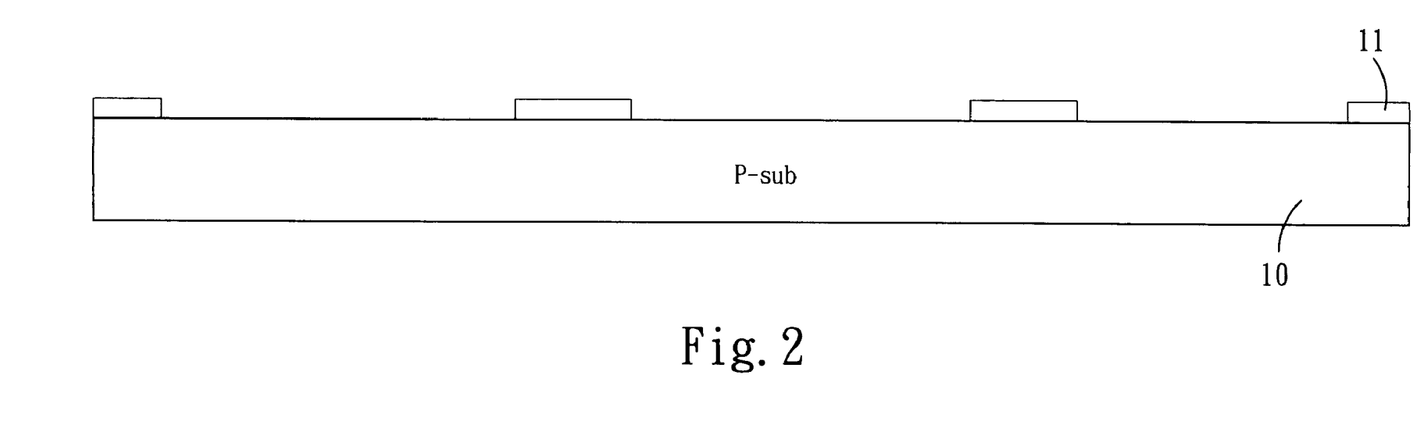

Refer to from FIG. 1 to FIG. 20 section views schematically showing the fabrication process of NDMOS. As shown in FIG. 1, a semiconductor substrate 10 (such as a P-substrate) is firstly provided, and an initial oxide layer 11 is formed on the surface of the substrate 10. Next, as shown in FIG. 2, via a lithographic process, the oxide layer 11 is selectively etched to form a shield mask of a required pattern, wherein some areas of the semiconductor substrate 10 are exposed, and N-type buried layers will be formed on the exposed areas of the substrate 10 in the following process.

Figure 3:
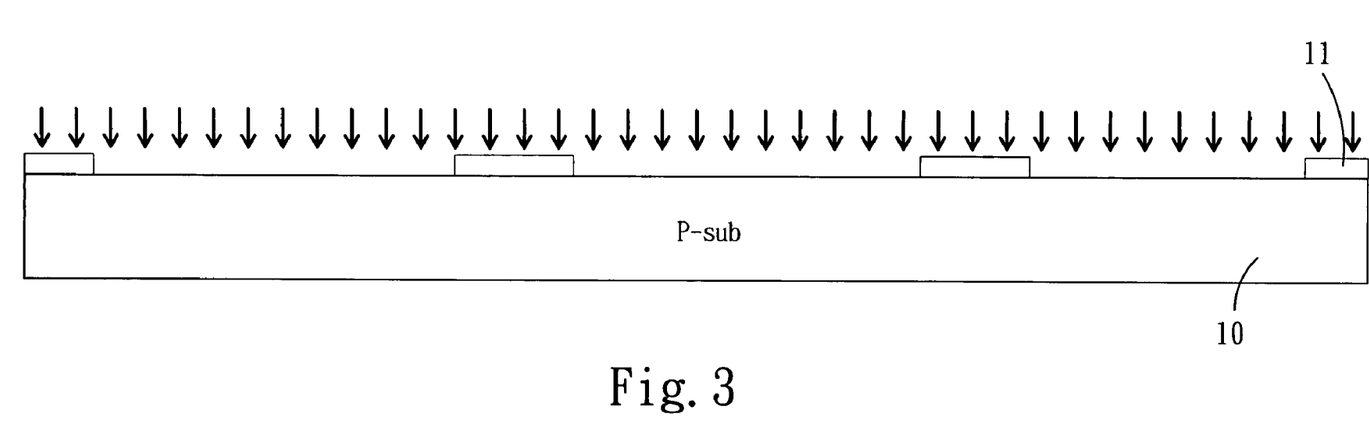
Figure 4:
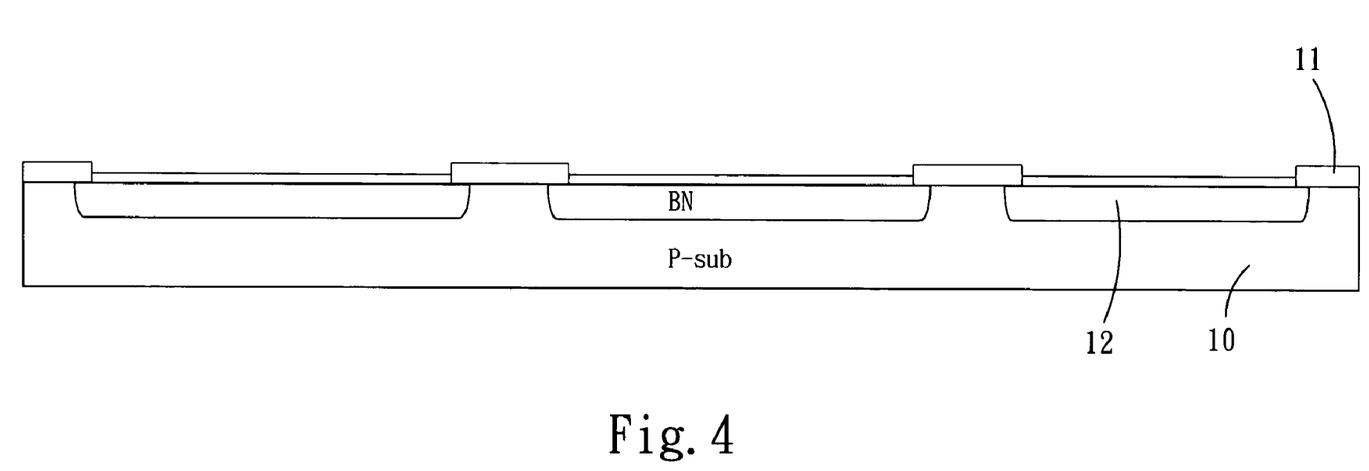

Next, as shown in FIG. 3, N-type ions, such as Sb ions or As ions, are implanted into the exposed areas of the substrate 10, and then, as shown in FIG. 4, a drive-in process is performed to form N-type buried layers 12.

Figure 5:
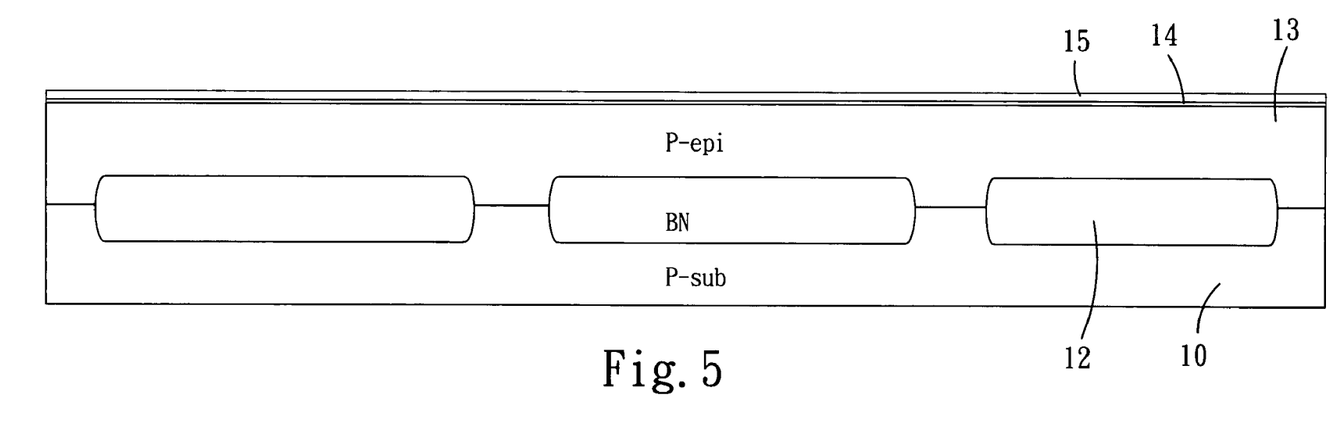
Figure 6:
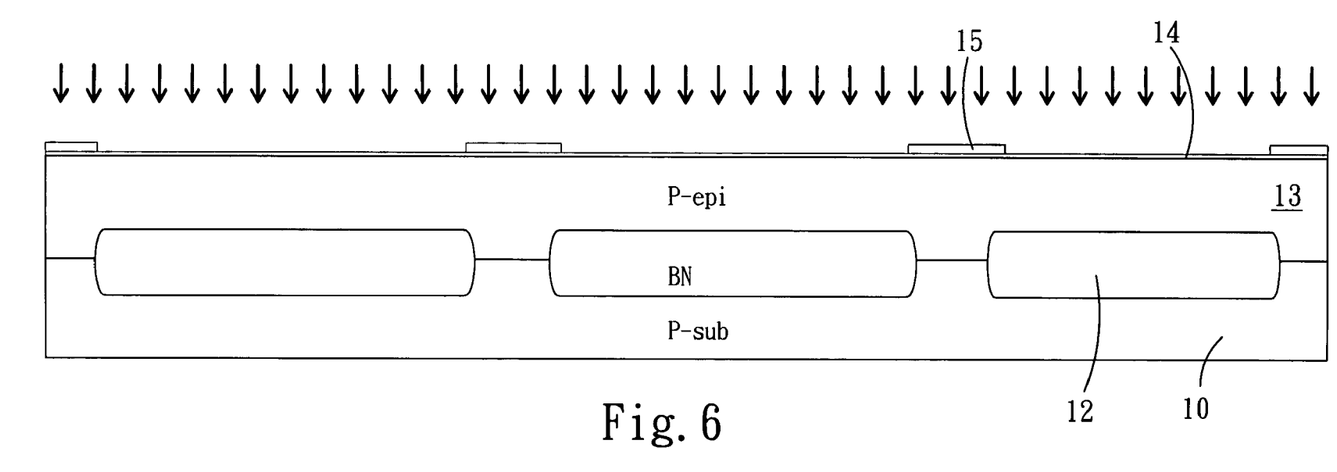
Figure 7:
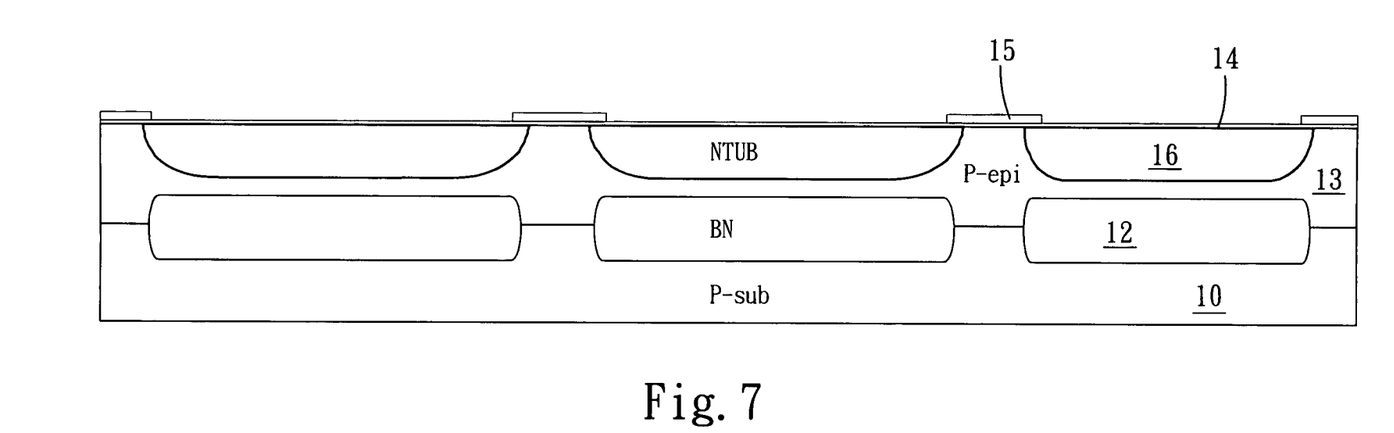

Next, as shown in FIG. 5, the oxide layer 11, which has been polluted by the N-type ions, is removed; then, a P-type epitaxial layer 13 is formed on the surface; then, an oxide ($SiO_2$) layer 14 is formed on the surface of the P-type epitaxial layer 13; and then, a silicon nitride ($Si_3N_4$) layer 15 is deposited on the surface of the oxide ($SiO_2$) layer 14. Next, as shown in FIG. 6, via a lithographic process, the silicon nitride ($Si_3N_4$) layer 15 is selectively etched to form a shield mask of a NTUB pattern, which is required in the succeeding process and exposes the oxide ($SiO_2$) layer 14 within the areas above NTUB regions, and then, ions are implanted into the exposed areas via a NTUB implant process. Next, as shown in FIG. 7, a NTUB drive-in process is performed to form required NTUB 16.

Figure 8:
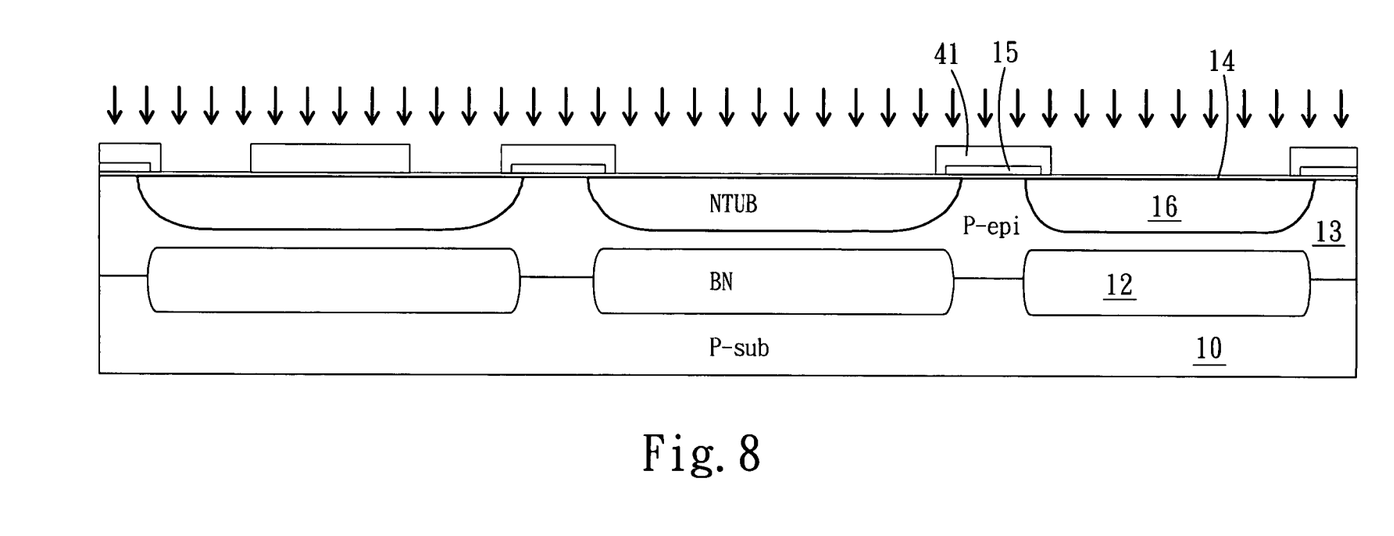

Refer to FIG. 8 to FIG. 11 further. As shown in FIG. 8, a photoresist layer 41 is formed on the surfaces of the oxide ($SiO_2$) layer 14 and the silicon nitride ($Si_3N_4$) layer 15; then, via a lithographic process, the photoresist layer 41 is processed to form a pattern of Nwell, which is required in the succeeding process and exposes Nwell-defining areas of the oxide ($SiO_2$) layer 14; and then, an Nwell implant process is performed.

Figures 9, 10:
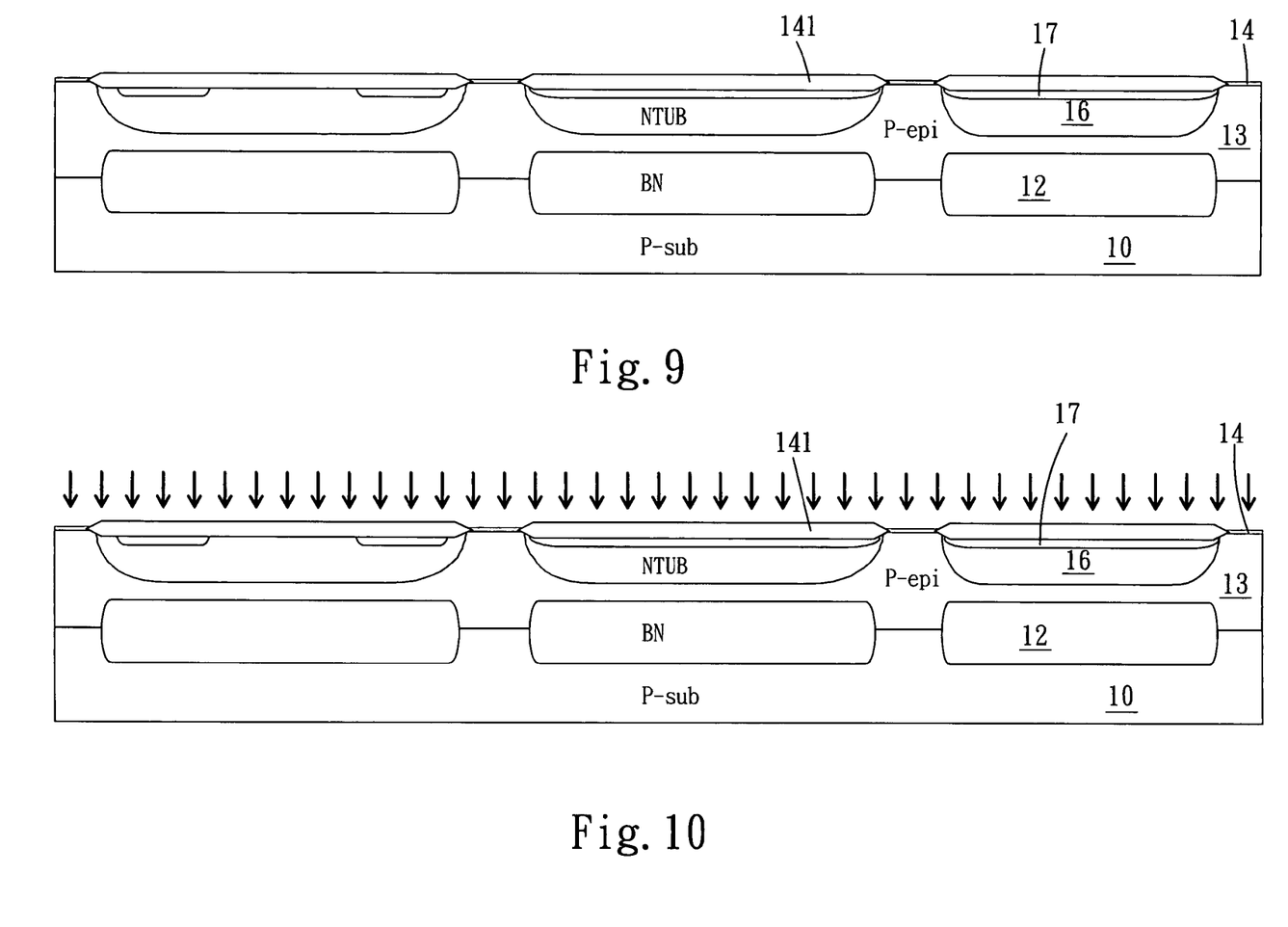
Figure 11:
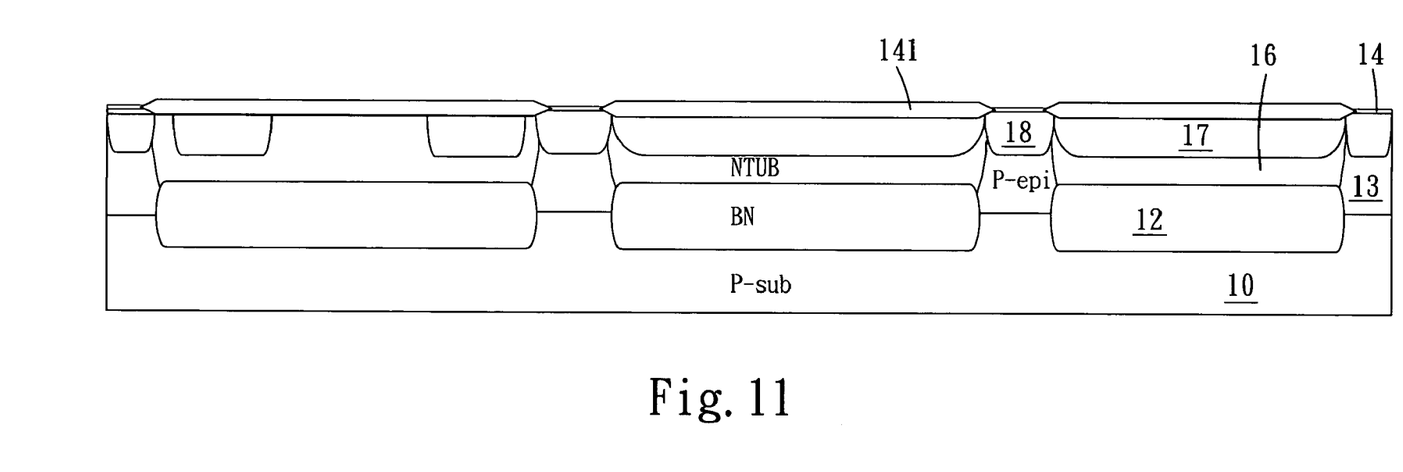

Next, as shown in FIG. 9, the photoresist layer 41 is removed; then, a thermal oxidation process is performed to grow local oxide layers 141 from the exposed oxide layers 14 of the active regions; after the thermal oxidation process, the silicon nitride ($Si_3N_4$) layer 15 is removed, and thus, the regions between those local oxide layers 141 can be used in the succeeding self-alignment PWell process. Next, as shown in FIG. 10, ions are implanted into the regions between those local oxide layers 141 via a Pwell implant process. Next, as shown in FIG. 11, a well drive-in process is performed to form required NTUB 16, NWells 17 and PWells 18.

Figure 12:
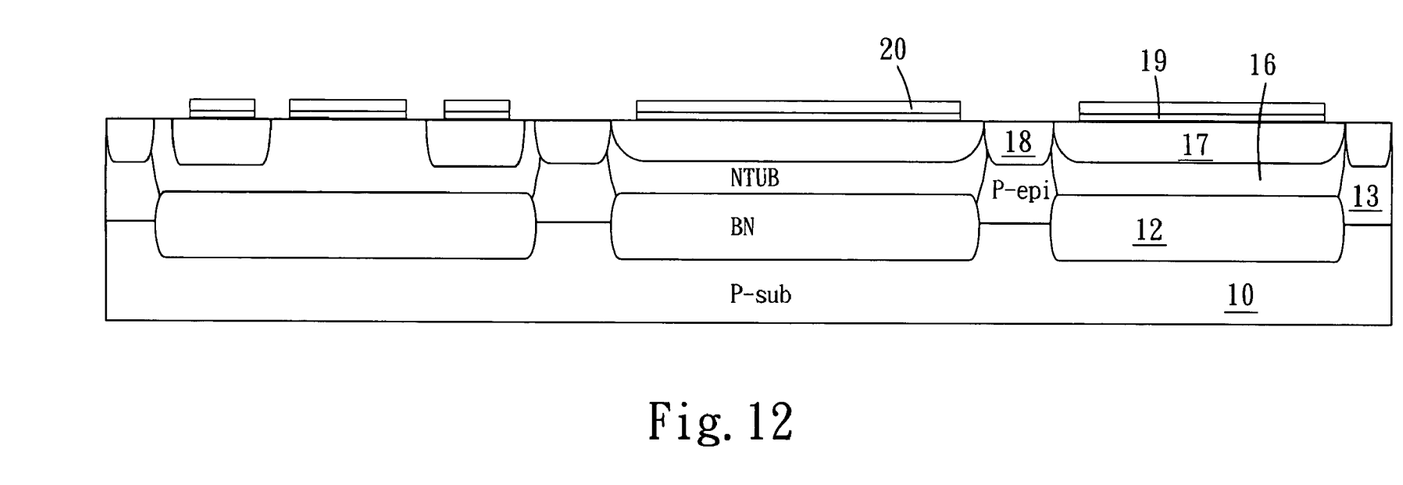
Figure 13:
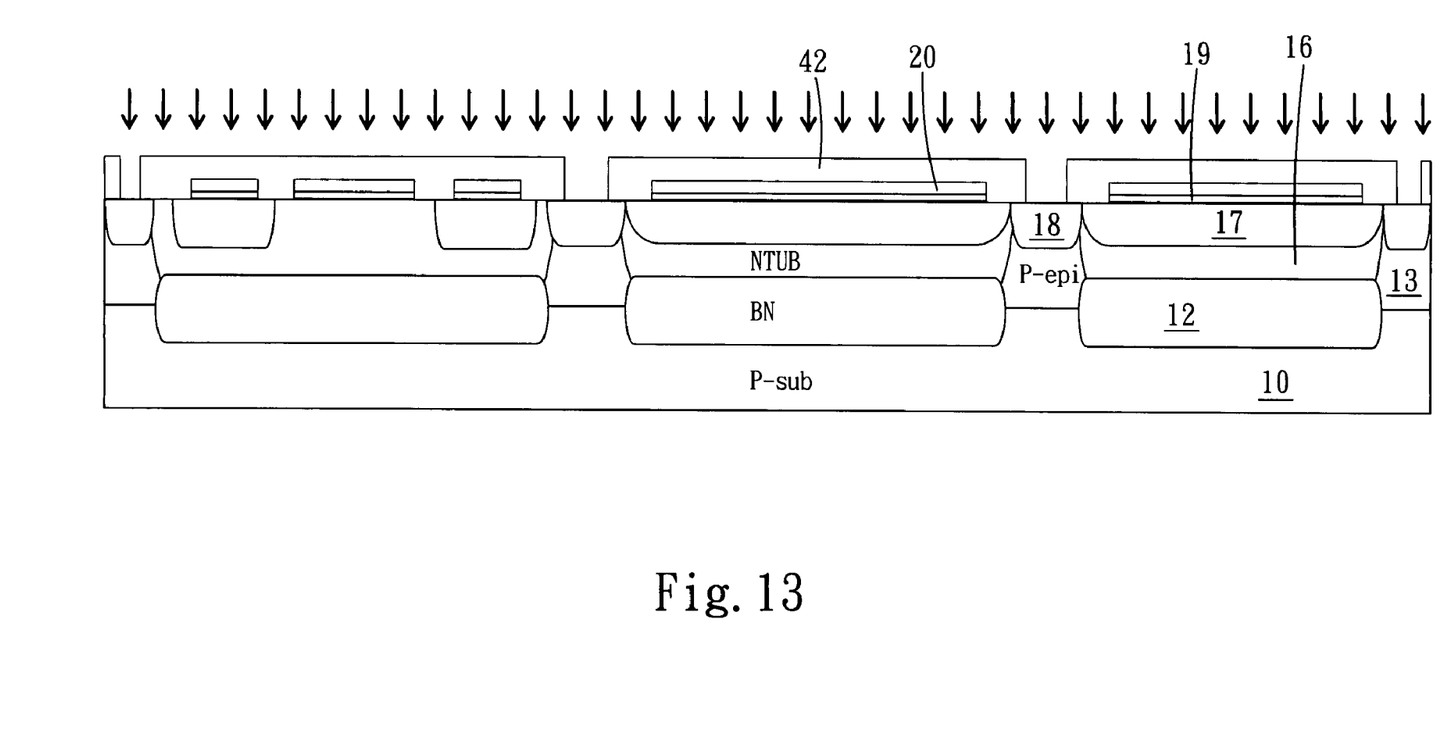
Figure 14:
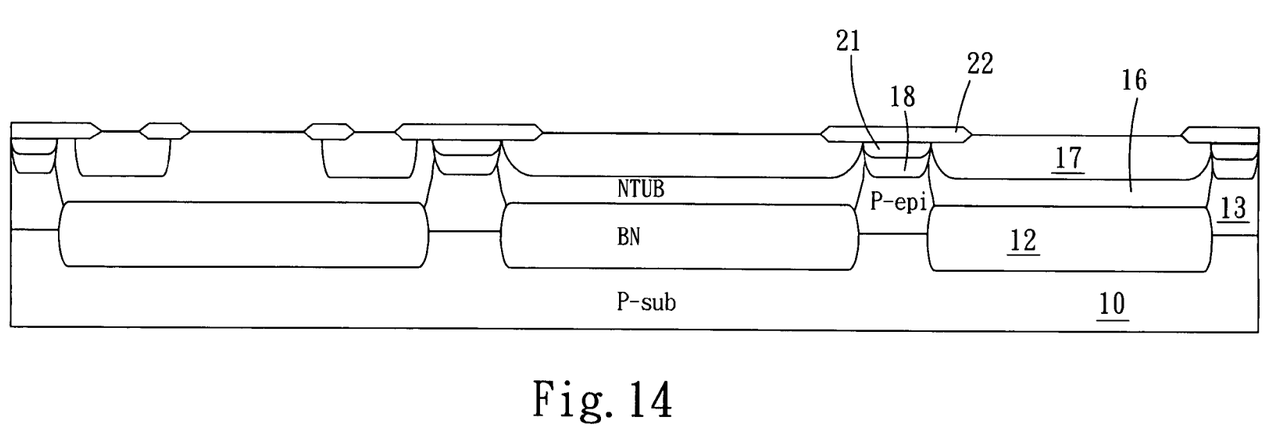

Refer to FIG. 12 to FIG. 14 further. As shown in FIG. 12, the oxide ($SiO_2$) layer 14 and the local oxide layers 141 are stripped away; then, an oxide layer 19 is formed, and a silicon nitride ($Si_3N_4$) layer 20 is formed on the surface of the oxide layer 19; and then, via a photographic process, the silicon nitride ($Si_3N_4$) layer 20 and the oxide layer 19 are selectively etched to form the pattern of active regions, which is required in the succeeding process. Next, as shown in FIG. 13, a photoresist layer 42 is formed on the abovementioned pattern of active regions; then, via a lithographic process, some areas of the photoresist layer 42 above the PWells 18 are removed to partially expose the PWells 18 and form a PFLD (field) pattern; and then, a PFLD implant process is performed. Next, as shown in FIG. 14, the photoresist layer 42 is removed; then, a thermal oxidation process is performed to form required field oxide layers 22 and PFLD 21; after the thermal oxidation process, the silicon nitride ($Si_3N_4$) layer 20 and the oxide layer 19 are removed.

Figure 15:
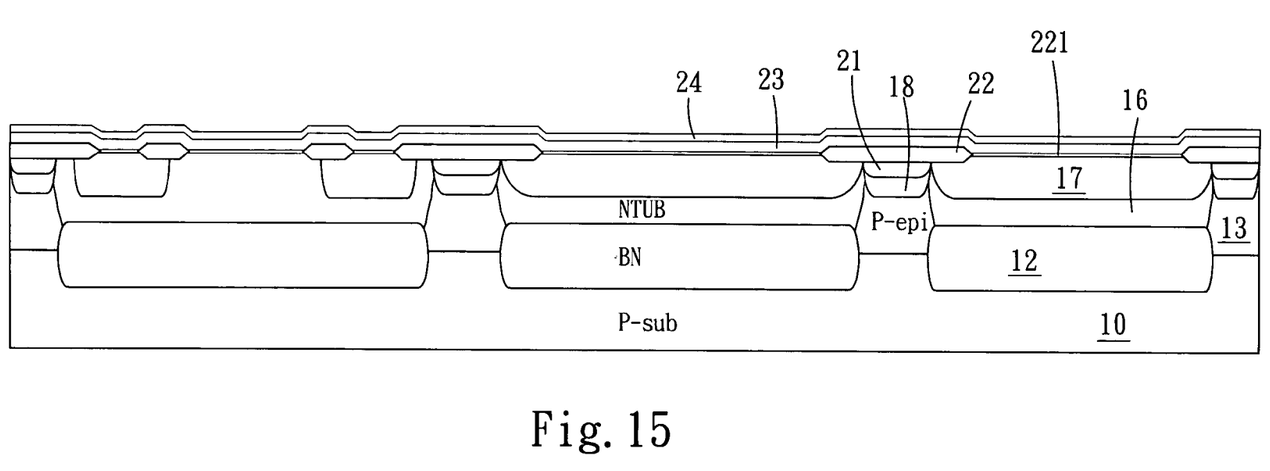
Figure 16:
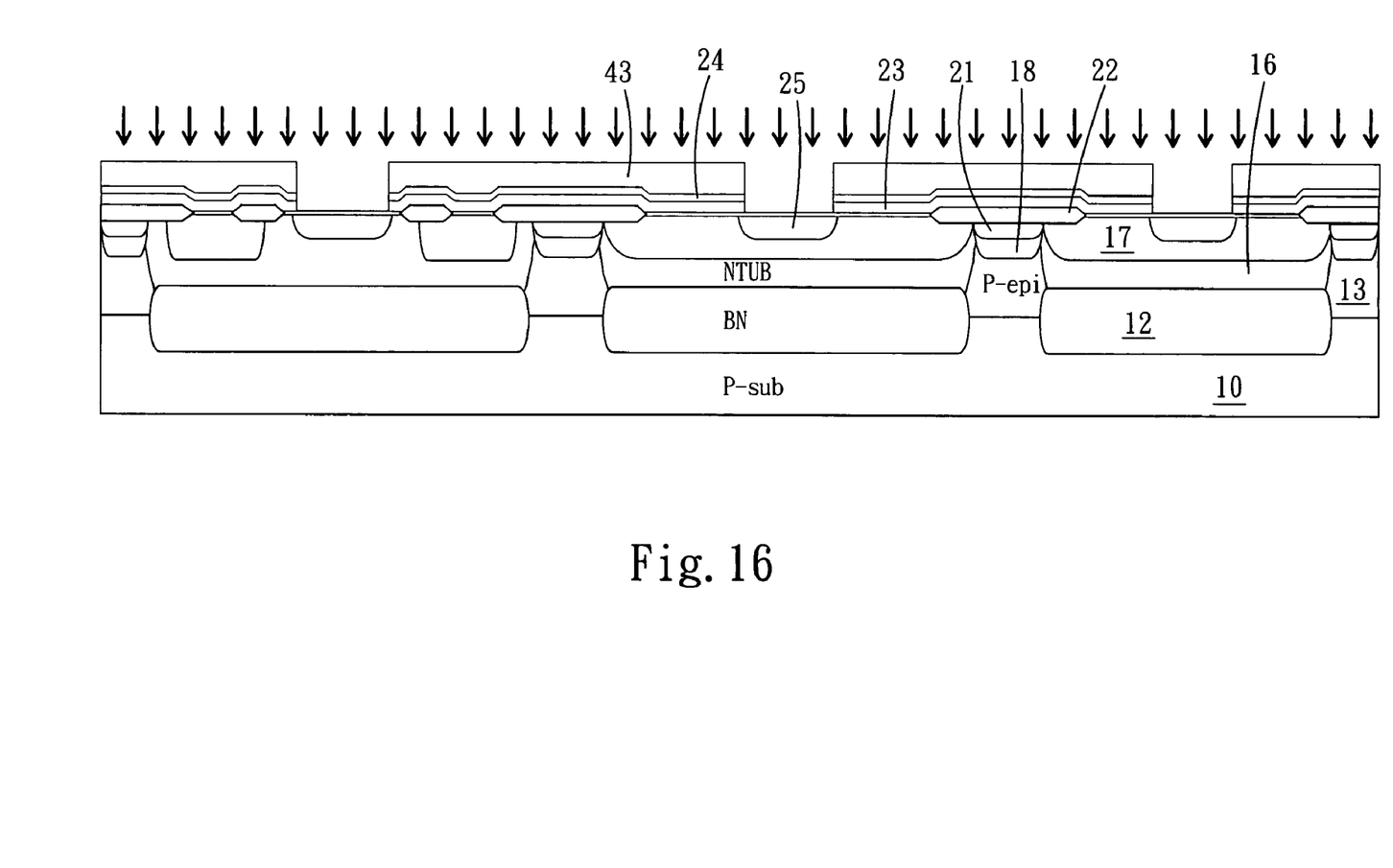

Refer to FIG. 15 and FIG. 16 further. As shown in FIG. 15, a sacrificed oxide layer 221, a first polysilicon layer 23 and a silicon nitride layer 24 are sequentially formed. Next, as shown in FIG. 16, a photoresist layer 43 is formed on the surface of the silicon nitride layer 24; then, a lithographic process is used to selectively remove the photoresist layer 43, the first polysilicon layer 23 and the silicon nitride layer 24 in order to partially expose the NWell 17 and the NWells 17 and form a required PBODY pattern; and then, a PBODY B+ implant process and a drive-in process are performed to form required PBODY 25, wherein DMOS body implant can use high energy implant only for low-voltage DMOS and high energy/low energy implant for high voltage DMOS to control the punchthrough voltage and threshold voltage separately.

Figure 17:
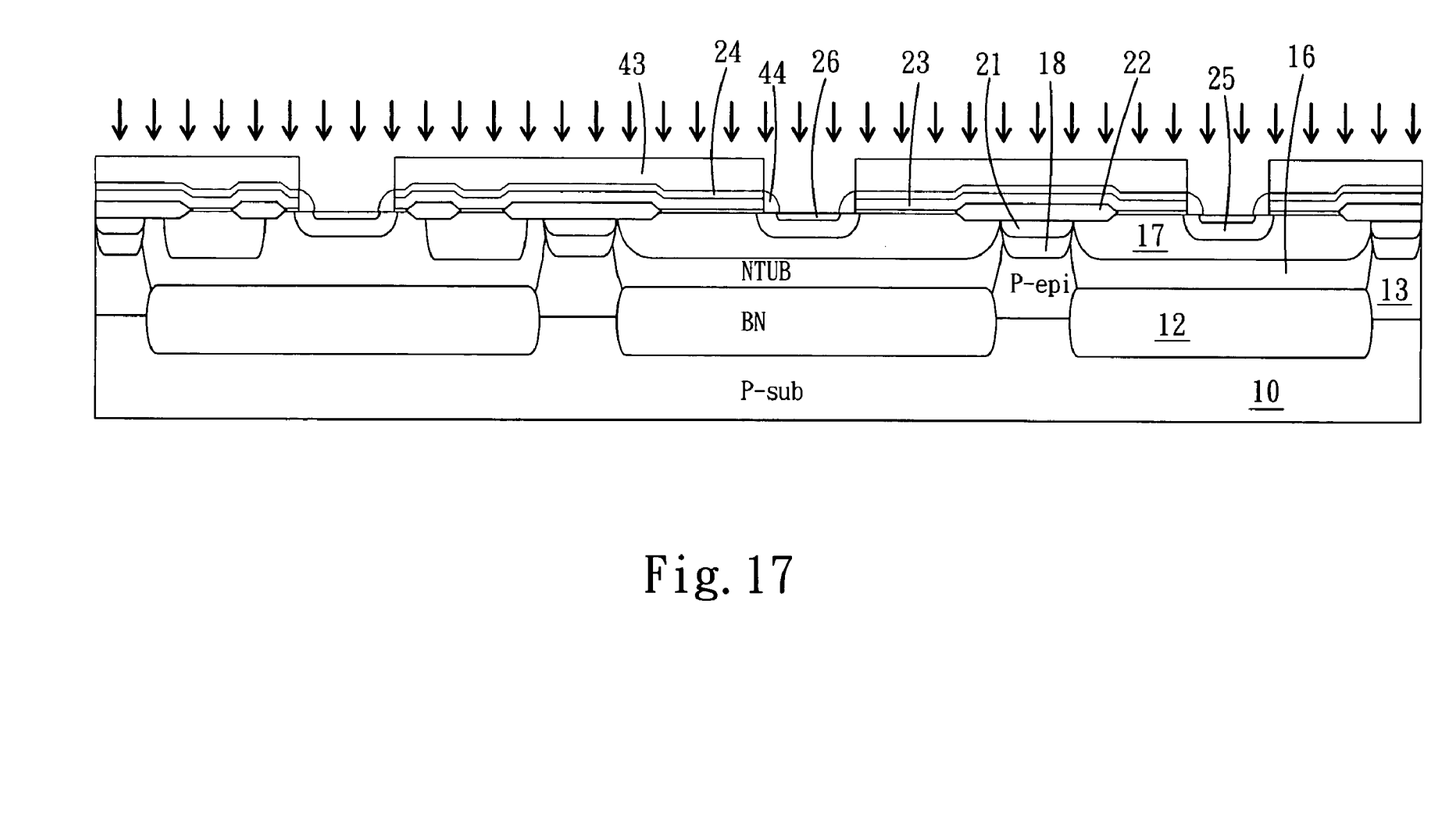
Figure 18:
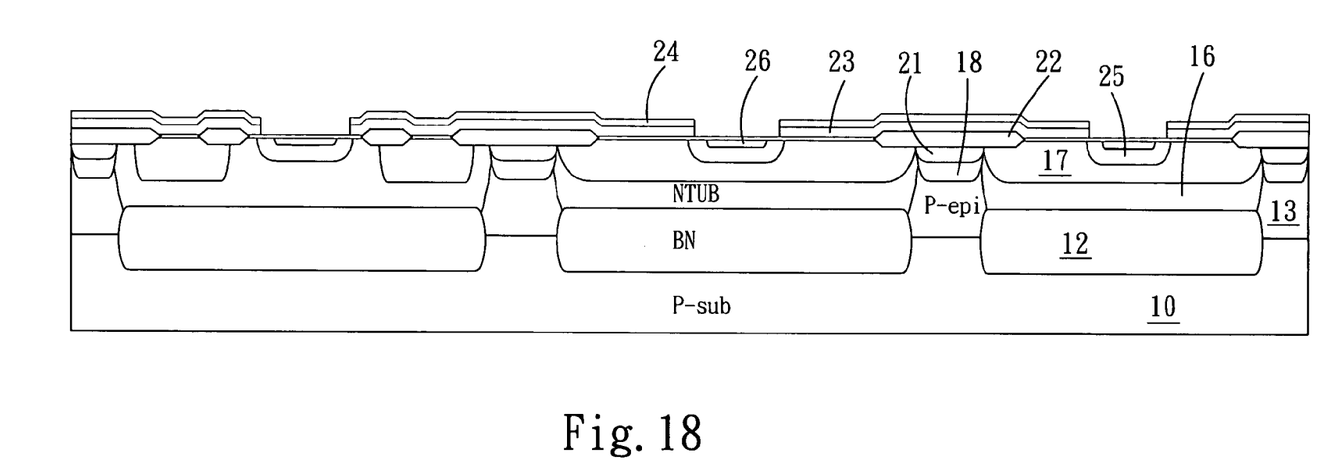

Refer to FIG. 17 and FIG. 18 further. As shown in FIG. 17, a PECVD process is used to form an oxide ($SiO_2$) film 44; then, a dry-etching process is performed to selectively remove the oxide ($SiO_2$) films 44 above the silicon nitride layers 24 and simultaneously form given-size openings on the central regions of the oxide ($SiO_2$) films 44 above the PBODY 25; then, ions are implanted into those openings via a DMOS source implant process to form required DMOS sources 26. The dose and the number of said body ion implants depend on the desired punch-through voltage and threshold voltage. Further, the dose of the DMOS source implant may be more than ten times the dose of the body ion implant. Next, as shown in FIG. 18, the photoresist layer 43 is removed, a wet-etching process is performed to remove all the oxide ($SiO_2$) films 44; and then, a moderate annealing and a moderate oxidation are performed.

Figure 19:
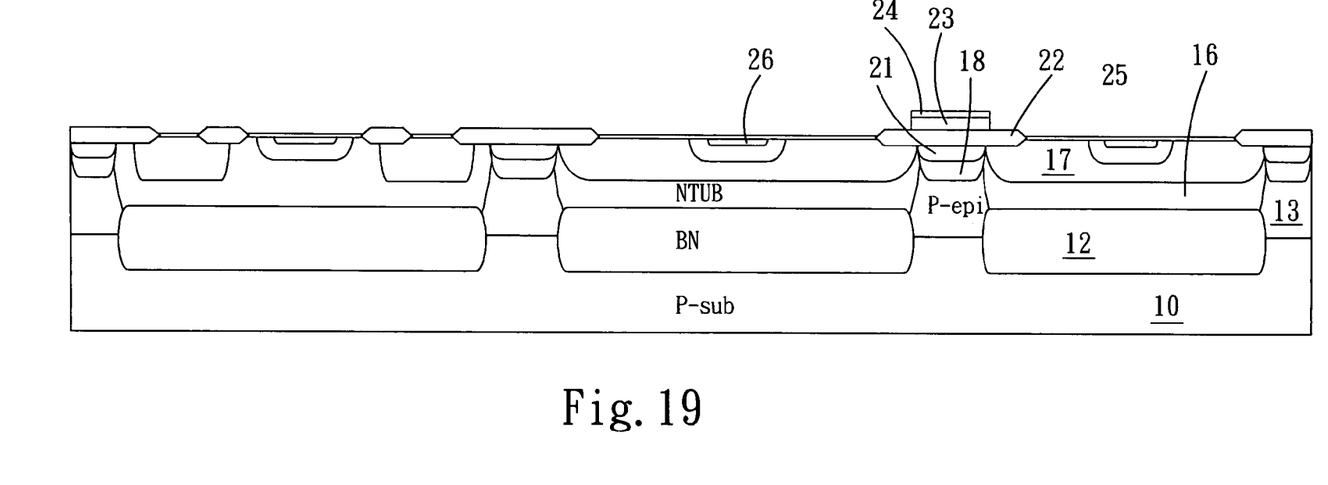

Next, as shown in FIG. 19, via a capacitor mask and a lithographic process, the silicon nitride layer 24 and the first polysilicon layer 23 are selectively etched so that the silicon nitride layers can function as 24 dielectric layers of capacitors, and the first polysilicon layers 23 can function lower electrodes of the capacitors.

Figure 20:
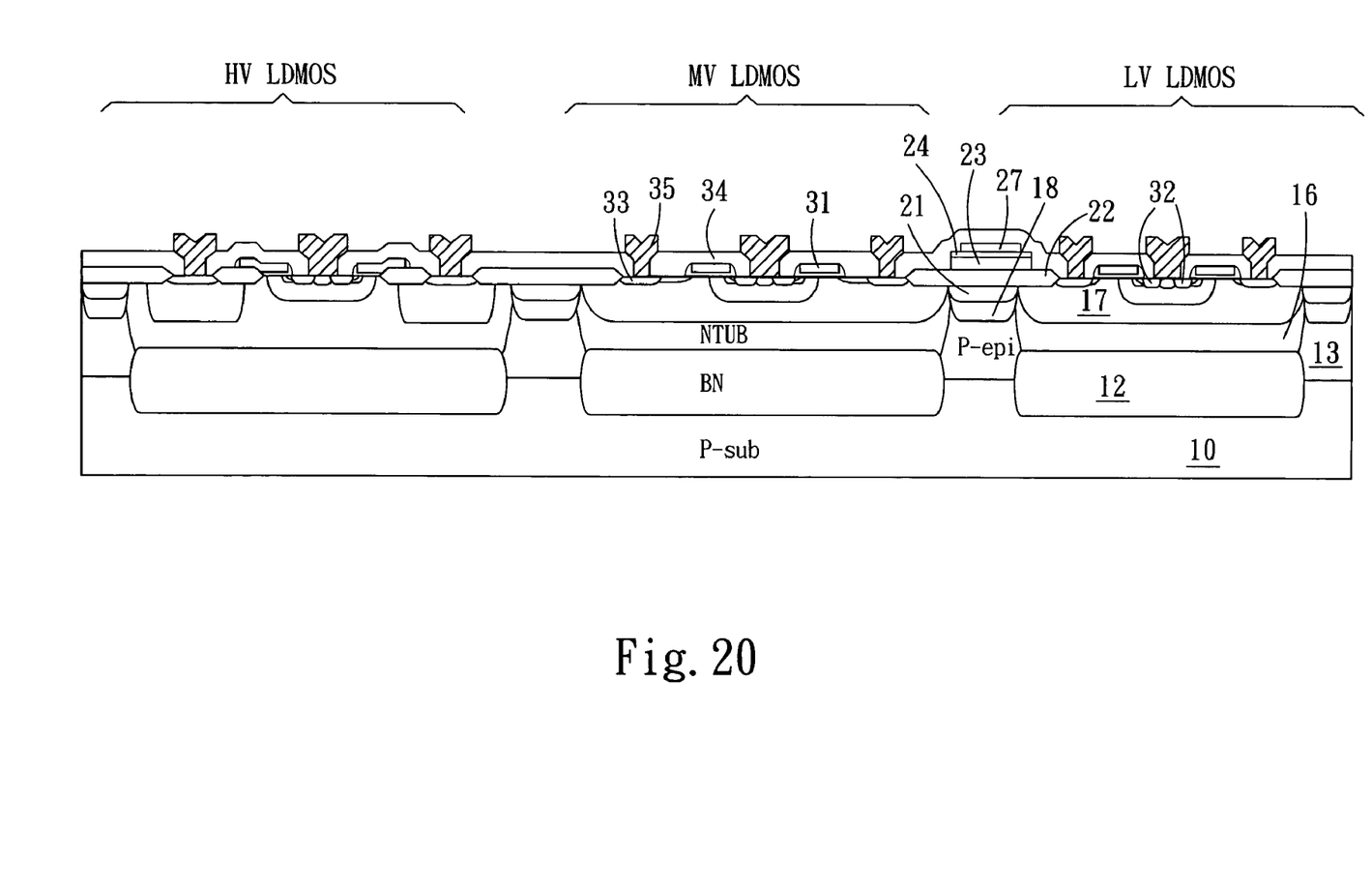

Next, as shown in FIG. 20, succeeding to the abovementioned processes, the standard CMOS process follows, and the following processes are sequentially performed, including: forming a second polysilicon layer 27 as upper electrodes of the capacitors and gate electrodes 31, and forming CMOS drain electrodes 32 and source electrodes 33 via an LDD (Lightly Doped Drain) process and the related structure. Then, a protective layer 34 is formed on the entire chip; next, the pattern of contact windows is defined on the protective layer 34, and the protective layer 34 is selectively etched to form the contact windows, and lastly, a metallic layer 35 is deposited and patterned on the protective layer 34. Thus, a structure, which includes: a high-voltage LDMOS, a middle-voltage LDMOS and a low-voltage LDMOS, is completed.

This invention provides a solution by forming the DMOS channel after CMOS active layer while before gate poly layer to make the modular DMOS process step easily adding into the sub-micron CMOS or BiCMOS process. The advantages of this method are:

1. DMOS body is formed by high energy implant only for low-voltage DMOS and high energy/low energy implant for high voltage DMOS to control the punchthrough voltage and threshold voltage separately.

2. DMOS source is formed by implant which is separated by a spacer self-aligned to the window for DMOS body.

3. A low temperature anneal is used to active the body implant and source implant. So, the DMOS channel is defined by the spacer width and following temperature cycle.

4. Since the DMOS body and source is formed before gate oxidation and CMOS Vt implant and gate poly, there is no influence to the sub-micron CMOS device performance. Thus, the DMOS and CMOS devices can be optimized separately.

5. It is easy to form NDMOS or PDMOS.

However, the above description is only a better practice example for the current invention, which is not used to limit the practice scope of the invention. All equivalent changes and modifications based on the claimed items of this invention are in the scope of the present invention.

What is claimed is:

1. A method for integrating double diffused metal oxide semiconductor (DMOS) into sub-micron complementary metal oxide semiconductor (CMOS) process, comprising the following steps:

burying buried layers of a required conductivity type into a semiconductor substrate, and forming tub and well structures needed in the succeeding steps, said well being formed in said tub;

defining active regions, and performing a thermal oxidation process to form required field oxide layers at ends of said well structures;

sequentially forming a first polysilicon layer and a silicon nitride layer, and patterning said first polysilicon layer and said silicon nitride layer to form a pattern required by DMOS bodies, and performing a body ion implant process and a drive-in process to form required DMOS bodies;

utilizing a plasma enhanced chemical vapor deposition (PECVD) process to form a silicon oxide ($SiO_2$) film, and utilizing a dry-etching process to selectively etch said silicon oxide ($SiO_2$) film in order to form given-size openings on the silicon oxide ($SiO_2$) films above said DMOS bodies, and utilizing said openings to perform a DMOS source implant process to form required DMOS sources; and performing the standard CMOS process, and sequentially forming DMOS gates, drains and pad electrodes.

2. The method according to claim 1, wherein the dose and the number of said body ion implant depend on required punchthrough voltage and threshold voltage.

3. The method according to claim 1, wherein said body ion implant and said DMOS source implant are separated by self-aligned spacers, and the dose of said DMOS source implant may be more than ten times the dose of said body ion implant.

4. The method according to claim 1, wherein after having formed said DMOS sources, a capacitor mask is used to selectively etch said first polysilicon layer and said silicon nitride layer so that said silicon nitride layer can function as a dielectric layer of a capacitor, and said first polysilicon layer can function as a lower electrode of said capacitor; a second polysilicon layer formed in said standard CMOS process is used as an upper electrode of said capacitor; thus, a capacitor structure is completed.

5. The method according to claim 1, wherein said tub structure and said well structure can be simultaneously one of N-type and P-type.

6. The method according to claim 1, wherein said DMOS bodies can be one of N-type and P-type, and the conductivity type of said DMOS bodies is different from that of said tub structure and said well structure.

7. The method according to claim 1, wherein said DMOS sources can be one of N-type and P-type, and the conductivity type of said DMOS sources is different from that of said DMOS bodies.

* * * * *